United States Patent [19]

Johnson

[11] Patent Number: 4,763,188
[45] Date of Patent: Aug. 9, 1988

[54] PACKAGING SYSTEM FOR MULTIPLE SEMICONDUCTOR DEVICES

[76] Inventor: Thomas Johnson, 1936 Highland, Northbrook, Ill. 60062

[21] Appl. No.: 117,917

[22] Filed: Nov. 4, 1987

Related U.S. Application Data

[63] Continuation of Ser. No. 894,557, Aug. 8, 1986, abandoned.

[51] Int. Cl.$^4$ .................................. H01L 23/02
[52] U.S. Cl. .................................. 357/74; 357/75; 357/70; 361/415
[58] Field of Search .............. 357/74, 75, 70, 80; 361/394, 399, 404, 412, 415

[56] References Cited

U.S. PATENT DOCUMENTS

| | | | |
|---|---|---|---|
| 3,564,114 | 2/1967 | Blinder et al. | 174/68.5 |
| 4,322,778 | 3/1982 | Barbour et al. | 361/414 |

FOREIGN PATENT DOCUMENTS

| | | | |
|---|---|---|---|
| 56-137665 | 3/1980 | Japan | 357/75 |
| 58-130553 | 8/1983 | Japan | 357/75 |
| 59-87841 | 5/1984 | Japan | 357/75 |

*Primary Examiner*—Andrew J. James
*Assistant Examiner*—Mark Prenty
*Attorney, Agent, or Firm*—Lockwood, Alex, FitzGibbon & Cummings

[57] ABSTRACT

An improved high density packaging system for interconnecting integrated circuit devices includes a tin alloy lead frame sandwiched between two multi-layer glass/epoxy substrates encapsulated in an injection molded plastic/epoxy package. Integrated circuit devices are mounted on the top of the upper substrate and on the bottom of the lower substrate to provide increased packaging density.

15 Claims, 6 Drawing Sheets

4,763,188

PACKAGING SYSTEM FOR MULTIPLE SEMICONDUCTOR DEVICES

This application is a continuation of application Ser. No. 894,557, filed Aug. 8, 1986 and now abandoned.

BACKGROUND OF THE INVENTION

This invention relates generally to semi-conductor devices, and more particularly to a packaging system for providing as a single unitary component multiple semi-conductor devices.

With the increasing complexity and miniaturization of present day electronic apparatus an increasing demand has developed for densely packaged integrated circuit devices. This demand has exceeded the ability of semi-conductor manufacturers to deliver specific monolithic solutions, thus creating a pressing need for a packaging system whereby a number of integrated circuit devices can be interconnected in a single component package. The present invention is directed to a packaging system which meets this requirement and combines a plurality of individual integrated circuit devices in a single unitary component which is mechanically compatible with previous generations of semi-conductor packages to take advantage of existing automatic manufacturing and assembly techniques.

Various techniques for the interconnection of individual semi-conductor devices in high density applications have been developed. One technique, which is described in U.S. Pat. No. 3,564,114, utilizes laminated multi-layer printed circuit boards for interconnecting individually packaged devices. Another technique, which is described by H. D. Kaiser et al. in an article entitled "A Fabrication Technique for Multi-Layer Ceramic Modules", *Solid State Technoloov.* May 1972, pages 35–40, utilizes multi-layer ceramic substrates capable of interconnecting either packaged or unpackaged semi-conductor devices on a single substrate.

These two techniques have been used to produce a number of different types of semi-conductor packages which provide increased packing density on a given parent circuit board. An example of one such package is a single in-line package (SIP) consisting of a small daughter substrate upon which several individually packaged semi-conductors are mounted. The daughter substrate has either an array of metal fingers soldered onto one side or a card edge connector for connection to the parent substrate/circuit board. The daughter substrate thus projects up perpendicular to the plane of the parent substrate and is connected on only one side.

Another example is the dual in-line package (DIP), which comprises a small multi-layer substrate upon which several packaged or unpackaged semi-conductor devices are mounted. An array of metallic fingers is soldered or brazed to the edge of the substrate and arranged so that the fingers extend at right angles to the substrate to make mechanical and electrical connections to an underlying parent substrate. The daughter substrate is thus parallel to the parent substrate and is connected on two or more sides. A variation of this construction is described in U.S. Pat. No. 4,322,778.

These packaging constructions provide at least two advantages as a result of packing more functionality into a given size package. Firstly, a smaller parent substrate is required to serve a given function. Secondly, the length of the interconnects between individual devices is reduced, resulting in the ability to derive higher performance from the resulting module.

The present invention improves on these constructions by providing a unitary component package of appreciably higher circuit density, which package is of standard configuration for mechanical compatibility with existing circuit constructions.

SUMMARY OF THE INVENTION

Accordingly, it is a general object of the invention to provide a new and improved construction for a multi-device semi-conductor component.

It is a more specific object of the invention to provide a multi-device semi-conductor component of greater density and of conventional lead configuration.

It is a further object of the present invention to provide a multi-device semi-conductor component package having improved heat dissipation, reduced cross-talk and improved reliability.

It is a still further object of the present invention to provide a multi-device semi-conductor component which can be readily and economically manufactured by known manufacturing techniques.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
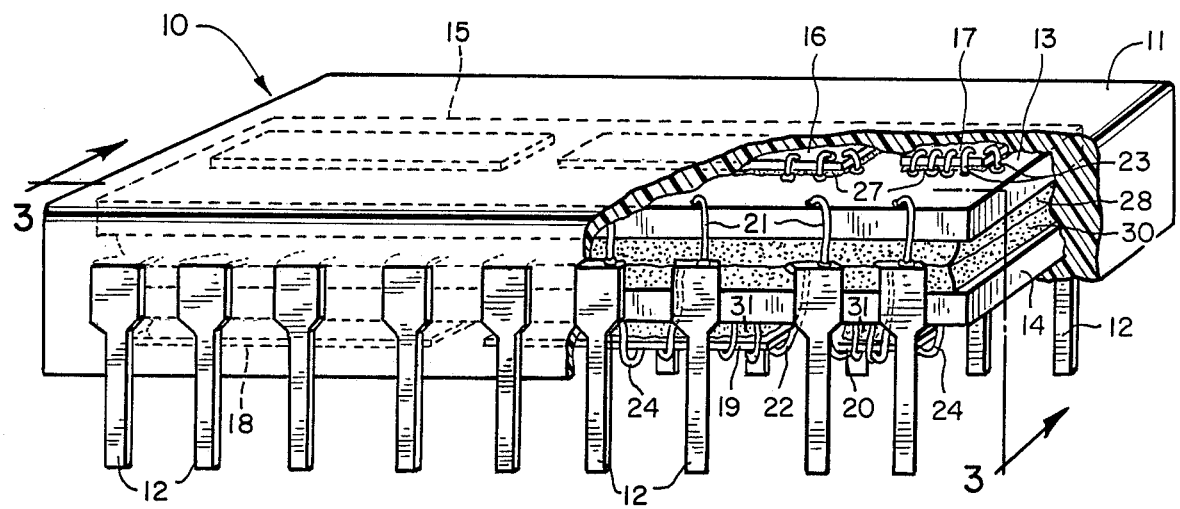
FIG. 1 is a perspective view of a multi-device semi-conductor component constructed in accordance with the invention partially broken away to show the principal elements thereof.
Figure 4:
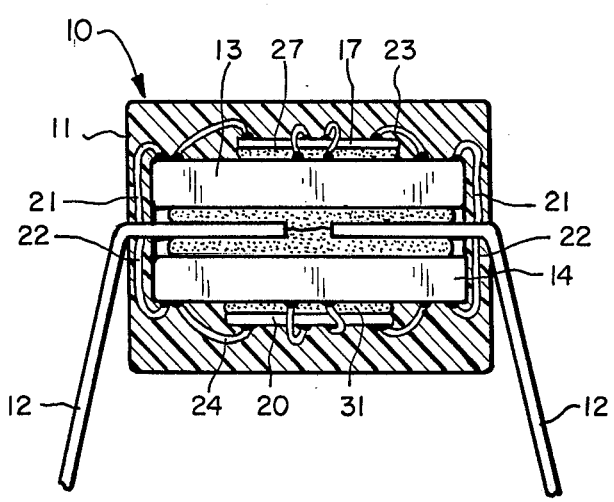
FIG. 4 is a cross-sectional view of the multi-device semi-conductor component taken along line 4—4 of FIG. 3.

Referring to the Figures, and particularly to FIG. 1, a multi-device semi-conductor component package 10 constructed in accordance with the invention is seen to generally comprise a rectangular encapsulation 11 from which a plurality of metallic leads 12 extend in two parallel-spaced rows adjacent respective sidewalls of the module. Preferably, the spacing between the lead rows and the number and spacing of individual leads conforms to an accepted packaging standard to facilitate interconnection of the component package 10 with existing circuit constructions. In the illustrated embodiment the lead arrangement is that of a conventional 18 pin dual in-line package (DIP).

The encapsulation layer 11, which may be formed of a plastic/epoxy molding compound using conventional manufacturing techniques, provides mechanical rigidity to the structure and serves to anchor each of leads 12 in position. Furthermore, the encapsulation provides protection against environmental hazards such as dust, moisture and mechanical shock, and provides a surface which can be readily manipulated with conventional automatic handling equipment.

Within the encapsulation layer 11 the semi-conductor module 10 is seen to include a pair of parallel-spaced substrate assemblies 13 and 14. The two substrate assemblies each consist of multi-layer printed circuit board substrate consisting of interspersed layers of interconnecting wiring isolated with layers of dielectric material in a manner well known to the art. Various circuit functions, such as power and ground interconnections, may be designated to different substrate planes to minimize cross-talk between adjacent layers and to provide consistent and predictable capacitance between individual runners.

Individual semi-conductor devices 15-17 may be provided on the outside (top) surface of substrate assembly 13, and a second plurality of individual semi-conductor devices 18-20 may be provided on the outside (bottom in FIG. 1) surface of substrate assembly 14. By reason of the unique mechanical and electrical interconnections provided between devices 15-20 within component 10 the component has an electrical capability substantially greater than could ordinarily be provided in the area occupied by the component on an underlying circuit board.

Electrical connections are established between substrate layer 13 and individual leads 12 by respective wire bonds 21, and between leads 12 and substrate assembly 14 by a plurality of wire bonds 22. Electrical communication is established between semi-conductor devices 15-17 and substrate assembly 13 by a plurality of wire bonds 23, and between semi-conductor devices 18-20 and substrate assembly 14 by a plurality of wire bonds 24.

Figure 2:
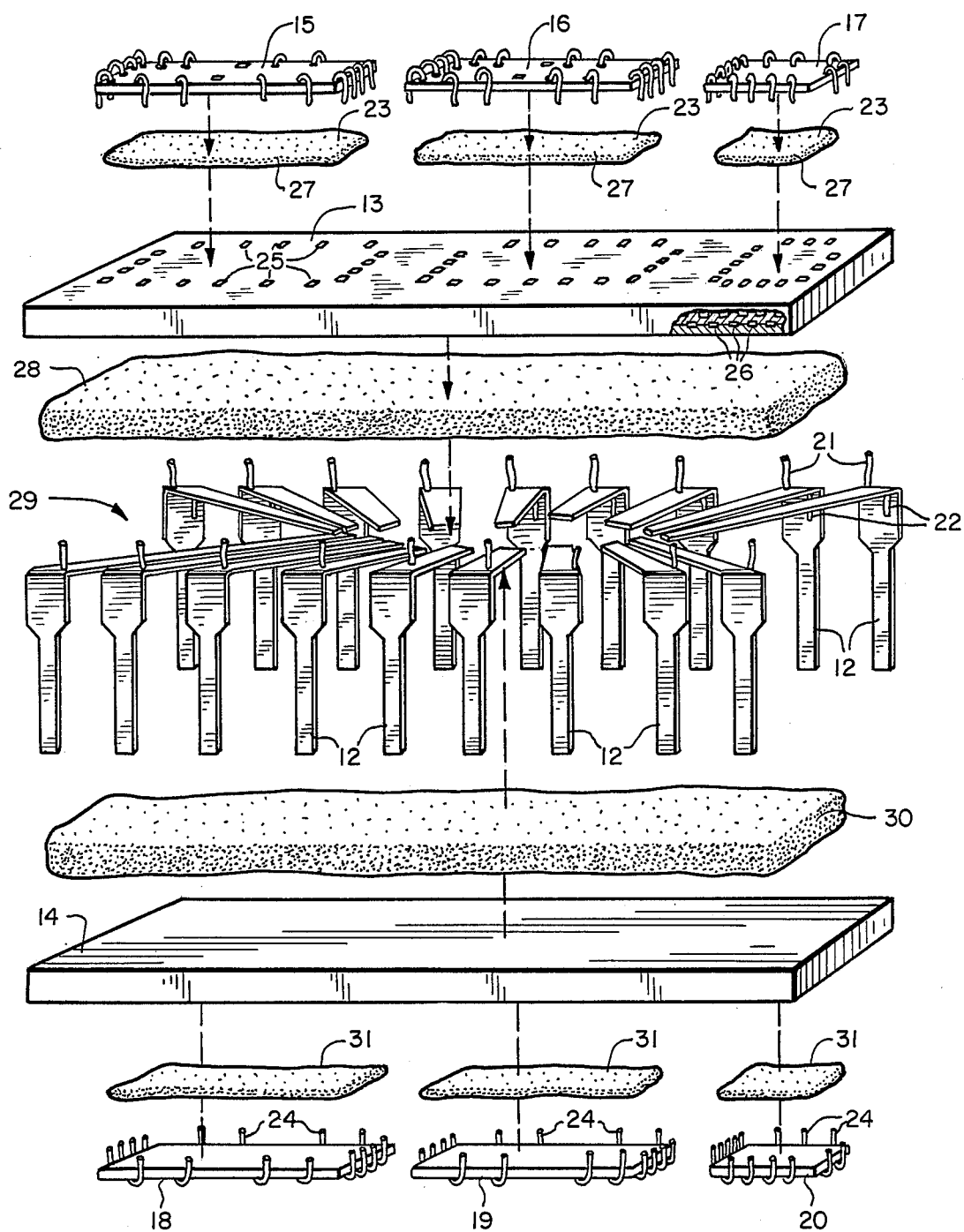
FIG. 2 is an exploded perspective view of the principal elements of the semi-conductor component of FIG. 1.
Figure 3:
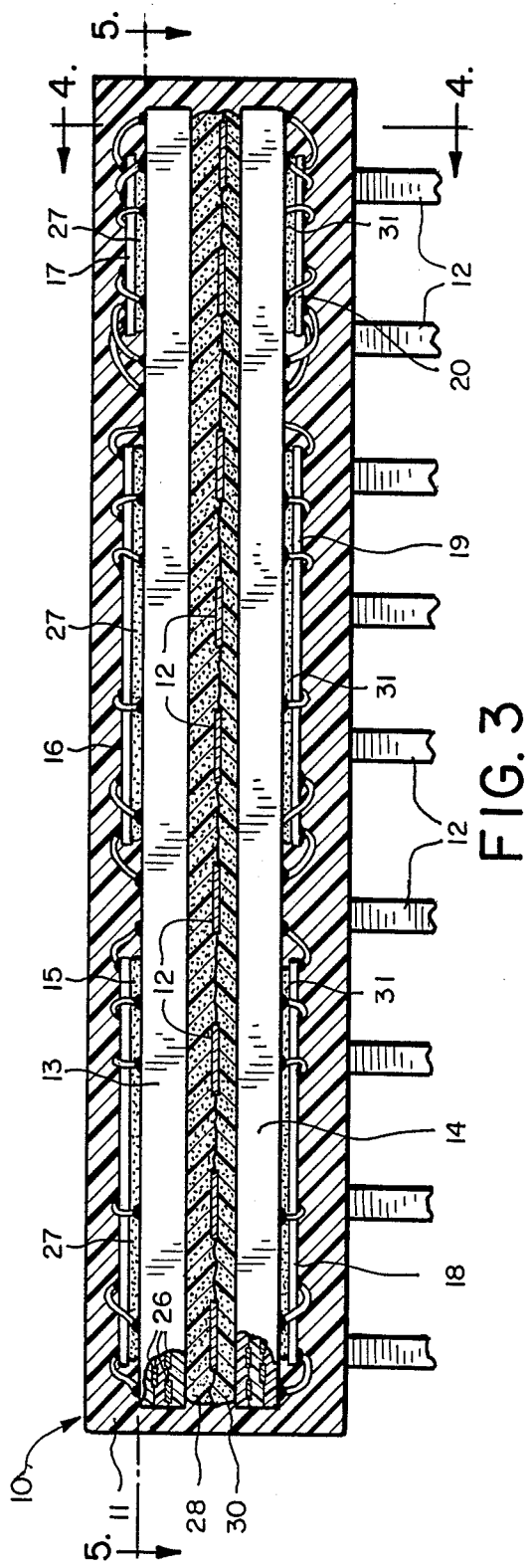
FIG. 3 is a cross-sectional view of the multi-device semi-conductor component taken along line 3—3 of FIG. 1.
Figure 5:
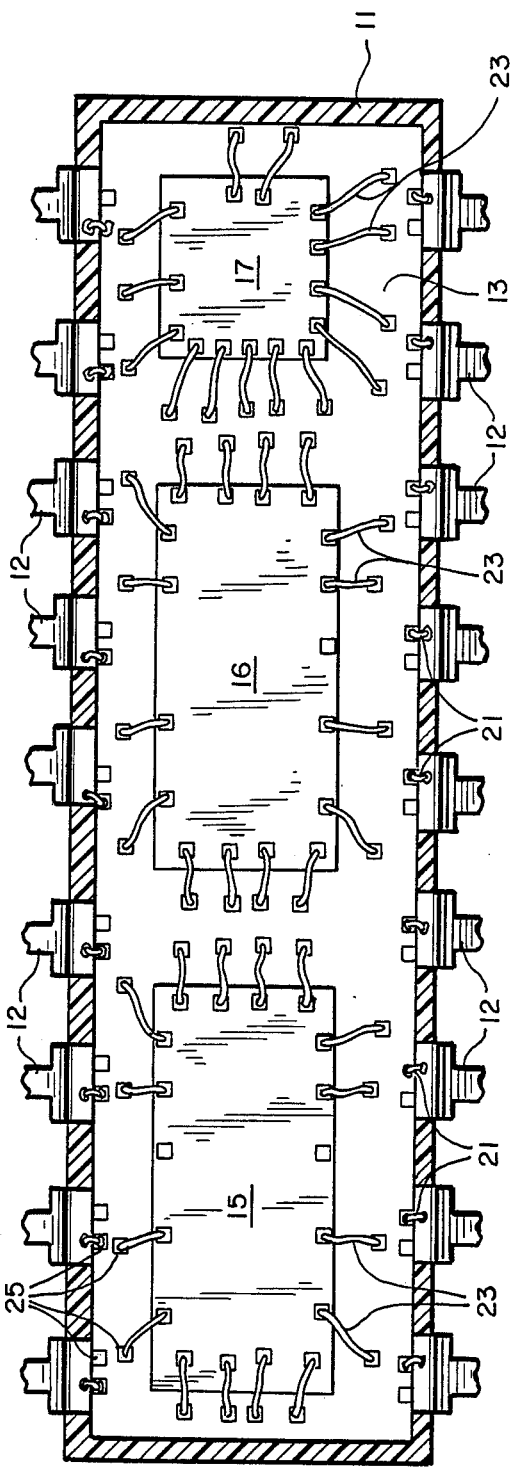
FIG. 5 is a top plan view of the multi-device semi-conductor component with the plastic encapsulation thereof removed showing the interconnections between the individual semi-conductor devices and substrate of the module.

Referring to FIG. 2, substrate assembly 13 includes on its outer surface a plurality of contact pads 25 to which wire bonds 21 and 23 are connected by conventional bonding methods. Within the substrate assembly 13 the contact pads 25 are interconnected by electrically conductive runners 26 arranged in various planes within the non-conductive body of the substrate. To this purpose, multiple planes of electrically conductive runners may be provided to isolate various circuits and to provide consistent and predictable capacitance characteristics between circuits. The construction and method of manufacture of such multiple plane substrate assemblies is well known to the art.

The individual semi-conductor devices 15-17 may be mounted to the outer surface of substrate assembly 13 by means of a layer 27 of epoxy or other suitable bonding material. Similarly, the individual connecting leads 12, which are arranged in a standard two row parallel-spaced configuration, are bonded to the inside or opposite surface of substrate assembly 13 by a layer 28 of epoxy of other suitable bonding material. To maintain precise alignment between the leads 12 during assembly, the leads may be first secured to substrate assembly 13 while joined together in a pre-formed lead frame having the desired final configuration. Then, the leads may be separated by a conventional clipping operation to provide electrical independence.

The lead frame 29 is preferably a stamped, flat sheet of tin alloy material. The regions where wire bonds are to be connected are typically spot plated with gold metalization. The entire lead frame is typically initially planar and the individual leads 12 are connected by a metal strip surrounding the entire lead frame structure. Subsequent to substrate attachment and plastic encapsulation, the surrounding metal strip is sheared off and the individual leads are bent at approximately a 90° angle to the plane of the substrates.

The lead frame 29 serves three functions in module 10. Firstly, the wire segments connecting the substrate assemblies 13 and 14 to the lead frame 29 provide electrical connections to external circuitry. Secondly, the lead frame provides electrical connections between the two substrates. Thirdly, the lead frame 29, because of its superior heat conduction capability, assists in dissipating heat generated by semi-conductor devices 15-20.

Substrate assembly 14 may be identical in construction to substrate assembly 13. This substrate assembly is attached to lead frame 29 by a layer 30 of epoxy of other suitable bonding material. Similarly, semi-conductor devices 18-20 are attached to the outside (bottom in FIG. 2) surface of substrate assembly 14 by a layer 31 of epoxy of other suitable bonding material.

The epoxy used to attach the semi-conductor devices 15-20 to the substrate assemblies 13 and 14, and the substrate assemblies to the lead frame 29, is of the non-electrically conductive type. The epoxy forms a mechanical connection between the devices and the substrate assemblies as well as between the substrate assemblies and the lead frame 29. The epoxy layers also provide electrical isolation between the surface metalization provided on the substrates and the lead frame 29.

The tin alloy lead frame 29 is sandwiched between the inside surfaces of the two substrate assemblies 13 and 14. The substrate assemblies are mechanically held in place by the layers 28 and 30 of non-conductive epoxy.

Figure 6:
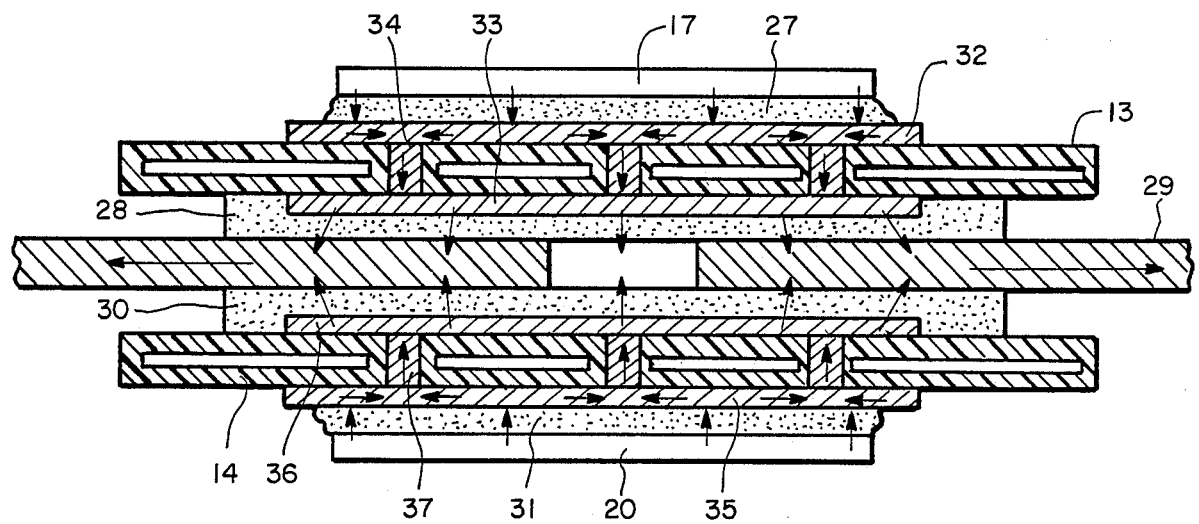
FIG. 6 is a simplified cross-sectional view of the multi-device semi-conductor component showing the heat transfer pattern between the principal elements thereof.

The metalization provided on the inside and outside surfaces of substrate assemblies 13 and 14, in addition to serving the conventional interconnect function, serves as a heat sink for the semi-conductor devices 15-20. As shown in FIG. 6, the metalization layers on the inside and outside surfaces of the substrate layers are connected in a conventional manner by metalized vias, which extend between the outside metalization layer and the inside metalization layer. Consequently, heat transferred from the semi-conductor devices is conducted from the outside metalization layer to the inside metalization layer, and from there through the intervening epoxy layer to the lead frame 29, which serves as a heat dissipating element.

The outside metalization layer 32 is connected to the inside metalization layer 33 of substrate assembly 13 by a metal-filled via 34. Similarly, the outside metalization layer 35 of substrate assembly 14 is connected to the inside metalization layer 36 by a metal-filled via 37.

Figure 7:
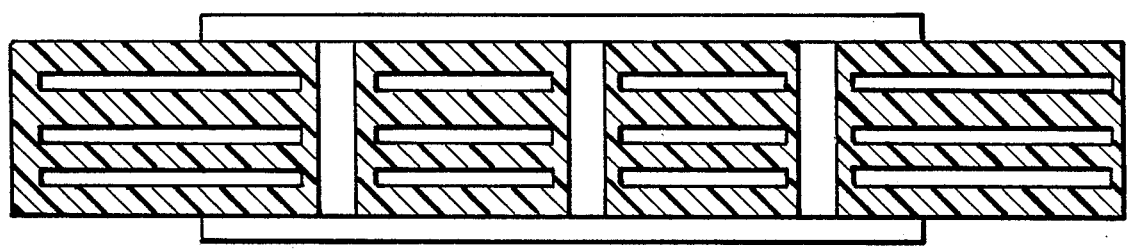
FIG. 7 is a simplified cross-sectional view of a single substrate of the component showing the arrangement of individual interconnecting wiring planes therein.

The substrate assemblies 13 and 14 may be made using conventional manufacturing procedures. Each may consist of an epoxy impregnated glass as described in U.S. Pat. No. 3,564,114. The substrates may also consist of multi-layered of multi-layered ceramic substrates bonded together by known methods. As shown in FIG. 7, power and ground connections are interspersed in respective planes within the substrate to reduce cross talk between adjacent layers and to provide a consistent and predictable capacitance characteristic between circuits.

The layer of metalization provided on the outside surfaces of substrate assemblies 13 and 14 serves to increase the reliability of the wire bonds provided between the substrate and the semi-conductor devices. The mechanical strength of these bonds rely on a close match between the elasticities of the metal in the connecting wire and the substrate surface. Accordingly, a corresponding metal is plated onto the substrate as the metalization layer to closely match the metalization of the wire bonds and maximize the strength of the bonds.

Thus, a novel construction is provided for a multi-device semi-conductor component by which a combination of functions from the multiple devices are provided in a standard-sized package requiring no more mounting space on a supporting circuit board than required by half of the devices if mounted separately.

Figure 8:
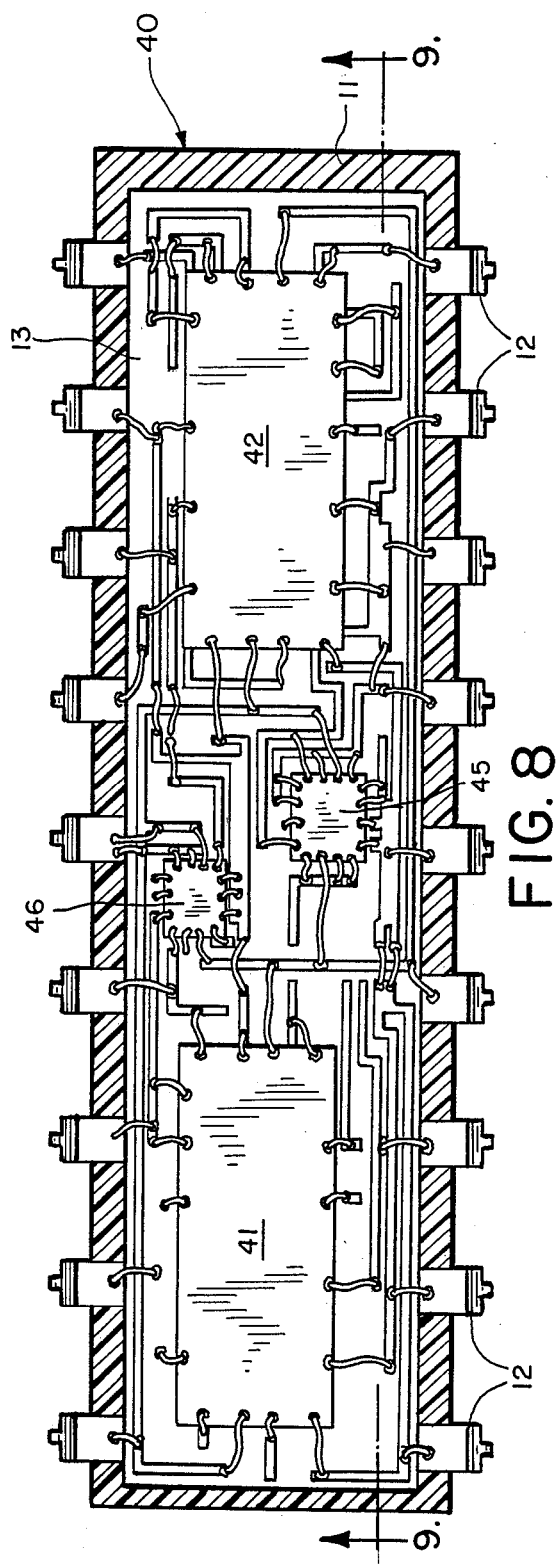
FIG. 8 is a top plan view of one megabit dynamic RAM component constructed in accordance with the invention utilizing four individual 256K RAM semiconductor devices.
Figure 9:
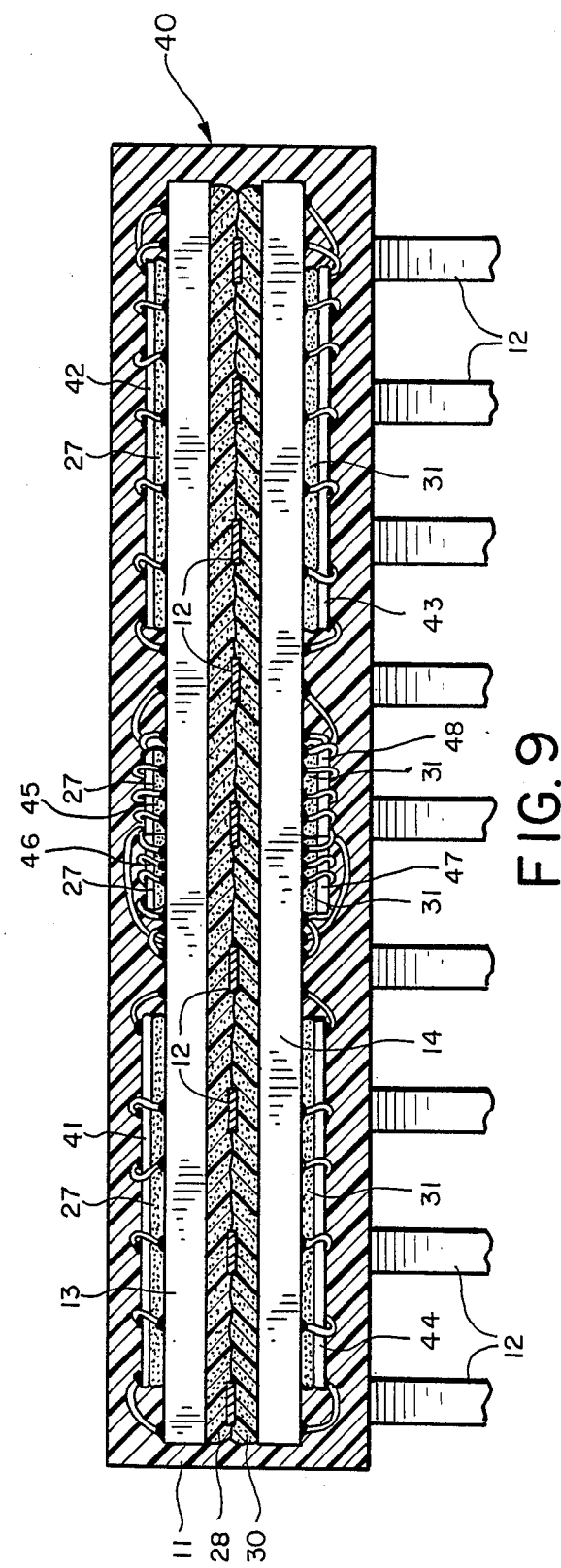
FIG. 9 is a cross-sectional view of the Dynamic RAM of FIG. 8 taken along lines 9—9 of FIG. 8.
Figure 10:
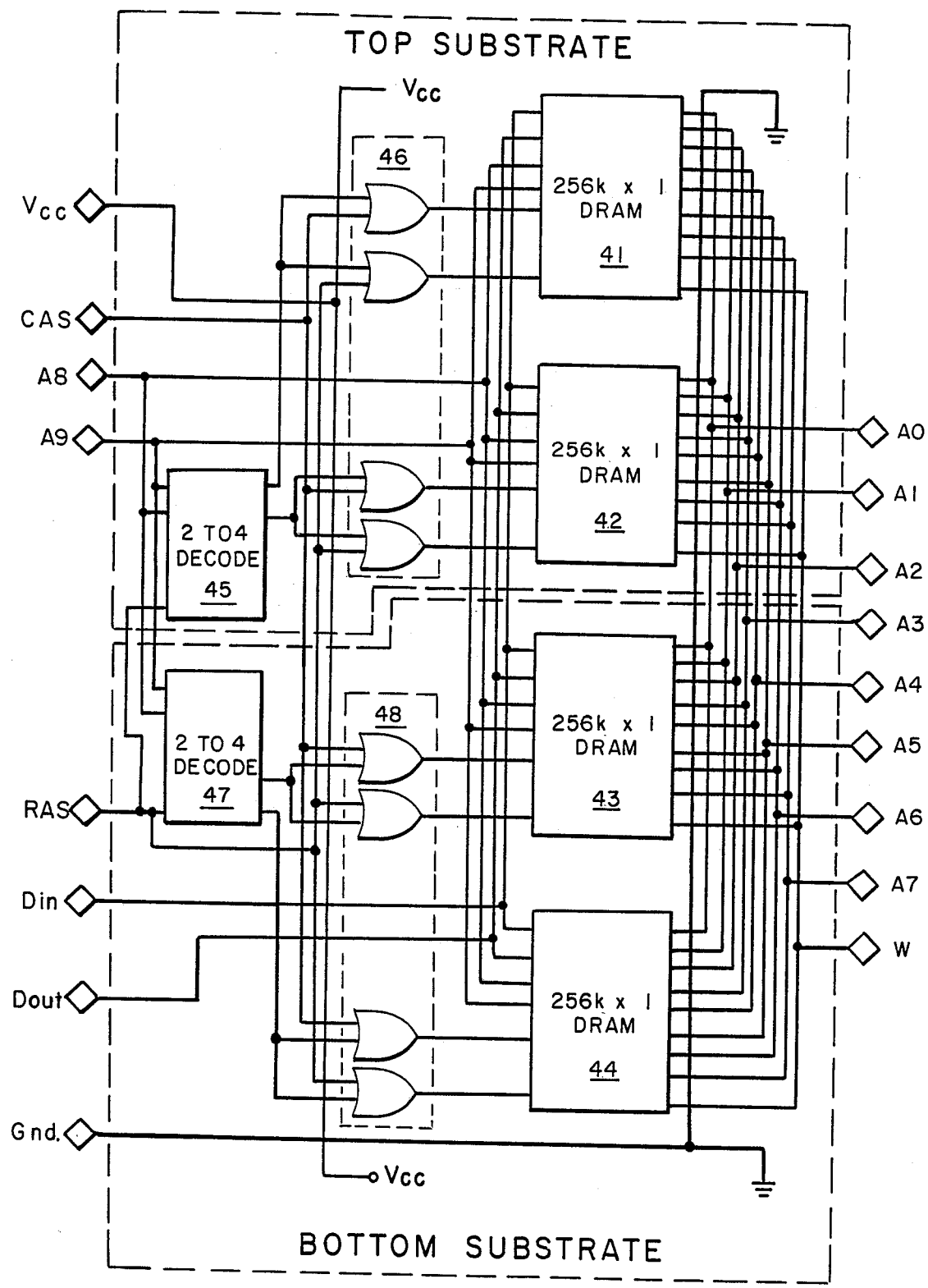
FIG. 10 is a schematic diagram of the dynamic RAM of FIG. 8.

In one contemplated application, four industry standard 256K dynamic RAMS are mounted together with address decoding logic on two multilayer circuit board substrates, as shown in FIGS. 8-10. The result is a one megabit memory module having package dimensions compatible with an industry standard 18 pin DIP package. It will be appreciated that various types of semiconductor devices may be incorporated in other applications.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A high density integrated circuit packaging system comprising:
  a first substrate assembly including a first generally wafer-shaped substrate having inside and outside surfaces, a first metalization layer forming a first electrical interconnection network on said outside surface, at least one integrated circuit device mounted on said outside surface and including a plurality of electrical contacts for establishing electrical connection therewith, and first electrical interconnection means for connecting said contacts with said first electrical interconnection network;
  a second substrate assembly including a second generally wafer-shaped substrate having inside and outside surfaces, a second metalization layer forming a second electrical interconnection network for devices and said outside surface, and at least one integrated circuit device mounted on said outside surface and including a plurality of electrical contacts for establishing electrical communication therewith, and second electrical interconnection means for connecting said contacts with said second electrical interconnection network;
  said substrates having like dimensions and being disposed in a parallel-spaced arrangement;
  a lead frame including a plurality of leads each having a proximate end and a distal end, said proximate ends of said leads being arranged in generally opposed pairs in a generally planar configuration and each including an interior portion disposed between and engaged by said inside surfaces of said substrates whereby said leads are fixedly positioned relative to said substrates, and an exterior poriton disposed outside of said substrate arrangement for establishing electrical, connections to said lead;
  bonding means for securing said substrates on either side of said interior portions of said proximate lead ends; and
  connection means for electrically interconnecting said exterior portions of said proximate lead ends with said first and second electrical interconnection networks whereby said integrated circuit devices are electrically interconnected and electrically accessible through said leads.

2. A high density integrated circuit packaging system as defined in claim 1 wherein said substrate assemblies are identical.

3. A high density integrated circuit packaging system as defined in claim 1 wherein each of said substrate assemblies comprises a multilayer circuit board.

4. A high density integrated circuit packaging system as defined in claim 1 wherein each of said substrates comprises a thin film ceramic substrate.

5. A high density integrated circuit packaging system as defined in claim 1 wherein said bonding means comprise a layer of epoxy material.

6. A high density integrated circuit packaging system as defined in claim 1 wherein said connection means comprise a plurality of wire segments.

7. A high density integrated circuit packaging system as defined in claim 1 including an encapsulation layer overlying said first and second substrates and said lead frame.

8. A high density integrated circuit packaging system as defined in claim 7 wherein said encapsulation layer comprises an epoxy or plastic material.

9. A high density semiconductor packaging system as defined in claim 1 wherein said first substrate assembly includes at least a first pair of said integrated circuit devices mounted on said outside surface, and said first electrical interconnection means interconnect the electrical contacts thereof through said first electrical interconnection network.

10. A high density integrated circuit packaging system as defined in claim 9 wherein said second substrate assembly includes at least a pair of said integrated circuit devices mounted on said outside surface, and said second electrical interconnection means interconnect the electrical contacts thereof through said second electrical interconnection network.

11. A high density integrated circuit packaging system as defined in claim 10 wherein said substrate assemblies are identical.

12. A high density integrated circuit packaging system as defined in claim 6 wherein said interconnection means comprise an additional plurality of wire segments.

13. A high density integrated circuit packaging system comprising:
   a first generally wafer-like substrate having an inside surface and an outside surface;
   a first metalization layer forming a first electrical interconnection network for devices on said outside surface of said first substrate;
   first and second discrete integrated circuit devices mounted on said outside surface of said first substrate, each of said devices including a plurality of electrical contacts for establishing electrical communication therewith;
   first electrical interconnection means for connecting said electrical contacts of said first and second devices with said first interconnection network to establish electrical communication between said first and second devices and said network;
   a second generally wafer-like substrate having an inside surface and an outside surface;
   a second metalization layer forming a second electrical interconnection network on said outside surface of said second substrate;
   third and fourth discrete integrated circuit devices mounted on said outside surface of said second substrate, each of said devices including a plurality of electrical contacts for establishing electrical communication therewith;
   second electrical interconnection means for connecting said electrical contacts of said third and fourth devices with said second interconnection network to establish electrical communication between said third and fourth devices and said network;
   said substrates having like dimensions and being disposed in a parallel-spaced arrangement;
   a lead frame including a plurality of leads each having a proximate end and a distal end, said proximate ends of said leads being arranged in generally opposed pairs in a generally planar configuration and each including an interior portion disposed between and engaged by said inside surfaces of said substrates whereby said leads are fixedly positioned relative to said substrates, and an exterior portion disposed outside of said substrate arrangement for establishing electrical connections to said lead;
   bonding means for securing said substrates on either side of said interior poritons of said proximate lead ends; and
   connection means for electrically interconnecting said exterior portions of said proximate lead ends with said first and second electrical interconnection networks whereby said first, second, third and fourth integrated circuit devices are electrically interconnected and electrically accessible through said leads.

14. A high density integrated circuit packaging system as defined in claim 13 wherein said connection means comprise a plurality of wire segments.

15. A high density integrated circuit packaging system as defined in claim 14 wherein said interconnection means comprise an additional plurality of wire segments.

* * * * *